(12) United States Patent
Strzalkowski (10) Patent No.: US 7,884,444 B2
(45) Date of Patent: Feb. 8, 2011

(54) SEMICONDUCTOR DEVICE INCLUDING A TRANSFORMER ON CHIP (75) Inventor: Bernhard Strzalkowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 70 days.

(21) Appl. No.: 12/177,257

(22) Filed: Jul. 22, 2008

(65) Prior Publication Data

US 2010/0019391 A1 Jan. 28, 2010

(51) Int. Cl.
H01L 27/08 (2006.01)

(52) U.S. Cl. .................. 257/531; 257/678; 257/685; 257/686; 257/690; 257/E21.022; 363/16

(58) Field of Classification Search .......... 257/531, 257/677, 678, 685, 686, 690, E21.022; 375/258; 363/16, 122; 326/30; 315/224
See application file for complete search history.

(56) References Cited

U.S. PATENT DOCUMENTS

| 5,418,394 | A | 5/1995 | Hertrich |
| 6,037,631 | A | 3/2000 | Deboy et al. |
| 6,181,231 | B1* | 1/2001 | Bartilson ............... 336/200 |
| 7,053,474 | B2* | 5/2006 | Otremba ............... 257/685 |
| 7,436,203 | B1* | 10/2008 | Hidri et al. ............ 326/30 |
| 7,525,820 | B2* | 4/2009 | Fukumoto ............. 363/16 |
| 2002/0122320 | A1 | 9/2002 | Brkovic |
| 2003/0034522 | A1 | 2/2003 | Klodzinski |
| 2004/0212419 | A1 | 10/2004 | Tihanyi |
| 2005/0230837 | A1 | 10/2005 | Taghizadeh-Kaschani |
| 2006/0091970 | A1* | 5/2006 | Mondal ................. 333/25 |
| 2007/0228534 | A1* | 10/2007 | Uno et al. .............. 257/678 |
| 2008/0260050 | A1* | 10/2008 | Dupuis ................. 375/258 |

* cited by examiner

Primary Examiner—N Drew Richards
Assistant Examiner—Yu-Hsi Sun (57) ABSTRACT This application relates to a semiconductor device comprising a first chip comprising a first electrode on a first face of the first chip, and a second chip attached to the first electrode, wherein the second chip comprises a transformer comprising a first winding and a second winding.

7 Claims, 7 Drawing Sheets

SEMICONDUCTOR DEVICE INCLUDING A TRANSFORMER ON CHIP

FIELD OF THE INVENTION

The present invention relates to a semiconductor device.

BACKGROUND

In the wake of increasing levels of function integration in semiconductor devices, the number of input/output channels of semiconductor devices has been rising continuously. At the same time, there is a demand to shorten signal channel lengths for high frequency applications, to improve heat dissipation, improve reliability, and to decrease manufacturing costs. Many of those objectives can be met by improving the way in which semiconductor chips are packaged.

SUMMARY

Accordingly, there is provided a semiconductor device comprising a first chip comprising a first electrode on a first face of the first chip, and a second chip attached to the first electrode. Further, the second chip comprises a transformer comprising a first winding and a second winding.

DETAILED DESCRIPTION

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Figure 1:
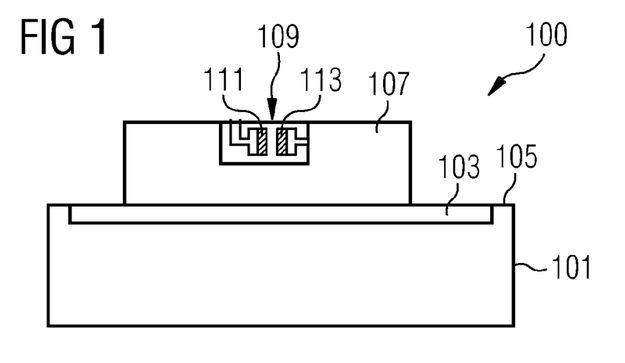
FIG. 1 discloses an embodiment of a semiconductor device comprising a first chip comprising a first electrode on a first face, and a second chip attached to the first electrode.

FIG. 1 schematically discloses an embodiment of a semiconductor device 100 including a first chip 101 with a first electrode 103 on a first face 105 of first chip 101. First electrode 103 may include a metal layer adapted to become sintered, soldered or glued to contact elements like a bond wire, a clip, an electrode of another chip, and the like. The size of first electrode 103 is defined by its surface area exposed on first face 105. FIG. 1 further discloses a second chip 107 whose backside is attached to first electrode 103. In one embodiment, the surface area of first electrode 103 is as large or larger than the area of the backside of second chip 107. This way, the complete backside area of second chip 107 may be in direct contact with the surface area of first electrode 103.

Second chip 107 comprises a transformer 109 having a first winding 111 and a second winding 113. First chip 101 and second chip 107 can each be semiconductor chips, e.g. a monolithic silicon chip. Each of the chips 101 and 107 may include at least one of an integrated circuit, a micro-electromechanical system (MEMS), an optoelectronic circuit, capacitive devices and the like. Transformer 109 may, or may not, include a magnetic core. First winding 111 and second winding 113 of transformer 109 are galvanically separated from each other. Further, first winding 111 may be galvanically separated from second chip 107 while second winding 113 may be directly coupled with second chip 107. This way, first winding 111 may be coupled with an electric reference potential that is different from the reference potential of second chip 107. The reference potential of a chip may be, for example, the potential of the substrate of the chip.

In one embodiment, second chip 107 is attached to the first electrode 103 by means that provide an electrically conductive connection between second chip 107 and first electrode 103. In this case, the reference potential of second chip 107 may be the potential of first electrode 103. Accordingly, signals transferred through transformer 109 from first winding 111 to second winding 113 may have a reference potential at second winding 113 that is equal to the potential of first electrode 103. In this case, transformer 109 may prevent a short circuit when the potential of first electrode 103 is different from the reference potential of first winding 111.

In one embodiment, second chip 107 may be attached to first electrode 103 by soldering, diffusion soldering, gluing or sintering. This can be done in ways well known in the art. For example, if both first electrode 103 and backside of second chip 107 are covered with a metal layer, second chip 107 may be soldered to first electrode 103 of first chip 101 by applying a solder material, e.g. a tin/lead solder, to either the backside of second chip 107 or to the surface of first electrode 103. After melting the solder under heat between first electrode 103 and the backside of second chip 107 and after cool down, the solder forms a low-ohmic metallic interface that rigidly connects second chip 107 with first electrode 103. The interface area is maximized when the surface area of first electrode 103 completely covers the backside of second chip 107. This helps further reducing the resistance between the substrate of second chip 107 and first electrode 103.

In another embodiment, an electrically conducting glue may be used to electrically connect the surface of first electrode 103 of first chip 101 with the backside of second chip 107. The electrically conducting glue may be, e.g., an epoxy filled with silver particles. In other embodiments, attachment of second chip 107 to first electrode 103 may be achieved by anodic bonding or diffusion soldering. In a sintering process, metallic particles, e.g. silver powder, may be used under pressure and a temperature of, say, between 100° C. and 200° C., to connect scond chip 107 to first electrode 103.

Figure 2:
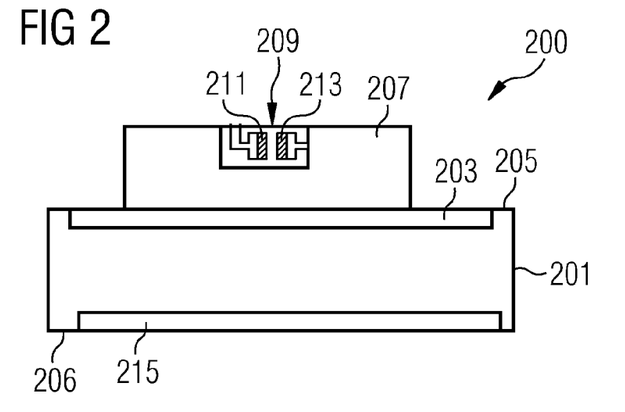
FIG. 2 discloses an embodiment of a semiconductor device comprising a first chip comprising a first electrode on a first face and a second electrode on a second face opposite to the first face, and a second chip attached to the first electrode in an electrically conducting manner.

FIG. 2 schematically discloses an embodiment of a semiconductor device 200 device wherein first chip 201 comprises a first electrode 203 on a first face 205 and a second electrode 215 on a second face 206 of first chip 201 opposite to first face 205. Second electrode 215 may be used to attach first chip 201 to a carrier in an electrically conductive way. In one embodiment, first electrode 203 and second electrode 215 may be load electrodes of a power transistor (power switch), e.g. of a vertical power transistor for switching load currents going from first electrode 203 to second electrode 215, or vice versa. The load current of vertical power transistors, depending on transistor type and application, may have sizes as large as one, ten or even hundreds of amperes. Power switches may be insulated gate bipolar transistors (IGBT), MOSFETs, JFETs, bipolar transistors, or thyristors. Generally, as is well known in the art, an IGBT has a gate contact as a control electrode and a collector contact and emitter contact as load electrodes, MOSFET and JFET have each a gate contact as a control electrode and a drain contact and source contact as load electrodes; and a bipolar transistor has a base contact as a control electrode and a collector contact and emitter contact as load electrodes.

Figure 3:
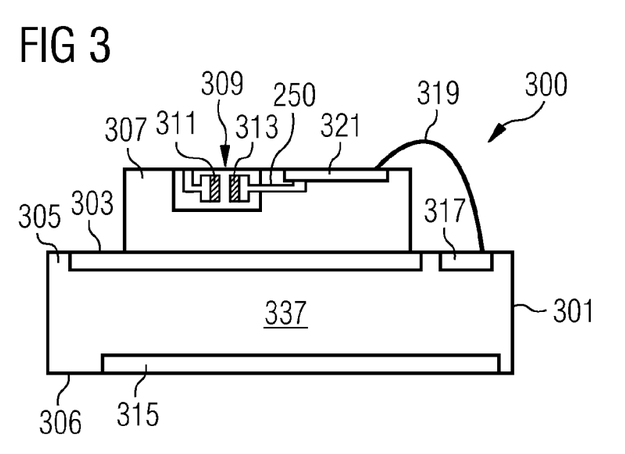
FIG. 3 discloses an embodiment of a semiconductor device comprising a first chip comprising a first electrode on a first face, a second chip attached to the first electrode, and means for electrically coupling the first chip to the second chip.

FIG. 3 schematically discloses an embodiment of a semiconductor device 300 comprising a first chip 301 having a first electrode 303 on a first face 305 of first chip 301, a second electrode 315 on a second face 306 of first chip 301 opposite to the first face 305, and a second chip 307 attached first electrode 303. Again, the size of the area of first electrode 303 may be as large or larger than the backside area of second chip 307. Second chip 307 further comprises a transformer 309 having a first winding 311 and a second winding 313. First chip 301 and second chip 307 may be the same chips as first chip 201 and second chip 207 of FIG. 2, or as first chip 101 and second chip 107 of FIG. 1. First chip 301 has a third electrode 317 that is electrically coupled with second winding 313. Further, the backside of second chip 307 is attached to first electrode 303 in an electrically conductive manner. For example, second chip 307 may be soldered to first electrode 303. This way, the reference potential of second winding 313 is given by the potential of first electrode 303.

In one embodiment, first chip 301 may be a power transistor 337 where first electrode 303 is is a source contact of power transistor 337, second electrode 315 is a drain contact of power transistor 337, and third electrode 317 is a gate contact of power transistor 337. In one embodiment, first chip 301 may be a insulated gate bipolar transistor (IGBT) 337 where first electrode 303 is is a emitter contact, second electrode 315 is a collector contact, and third electrode 317 is a base contact.

In one embodiment, second winding 313 is electrically coupled with the at least one third electrode 317 by means of one or several bond wires 319. Since a vertical current between source contact 303 and drain contact 315 of a power transistor 337 may be controlled by the voltage difference between gate contact 317 and source contact 303, and since the reference potential of second winding 313 is defined by the potential of first electrode 303, a voltage signal through bond wire 319 to gate contact 317 may be used to control the vertical current between source contact 303 and drain contact 315. Note that bond wire 319 may be also replaced by other connection elements, like a bond ribbon, a clip, or a conducting line applied over second chip 307 and first chip 301 after attachment of second chip 307 to first electrode 303.

FIG. 3 also discloses an integrated circuit 321 integrated in second chip 307. Integrated circuit 321 may be electrically coupled to second winding 313 by means of one or two connection lines 250 that connect second winding 313 with integrated circuit 321. Integrated circuit 321 is also coupled to gate contact 317 by means of bond wire 319. Integrated circuit 321 may include a receiver circuit (not shown in FIG. 3) that is to convert a signal received from transformer 309 to deliver an output signal at gate contact 317 that controls the load current between source contact 303 and drain contact 315 in a predetermined way.

Figure 4A:
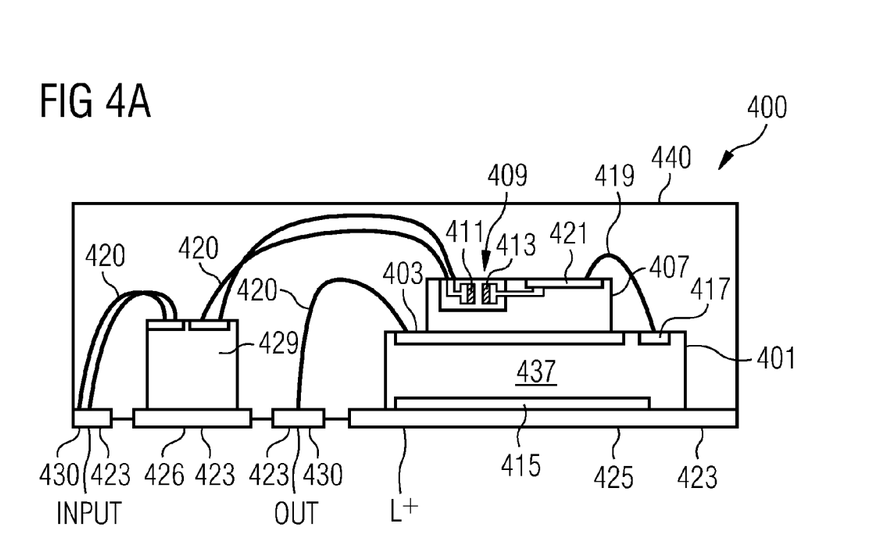
FIGS. 4A and 4B disclose an embodiment of a semiconductor device comprising a first chip comprising a first electrode on a first face, a second chip attached to the first electrode and comprising a transformer, and a chip electrically coupled to the transformer of the second chip.
Figure 4B:
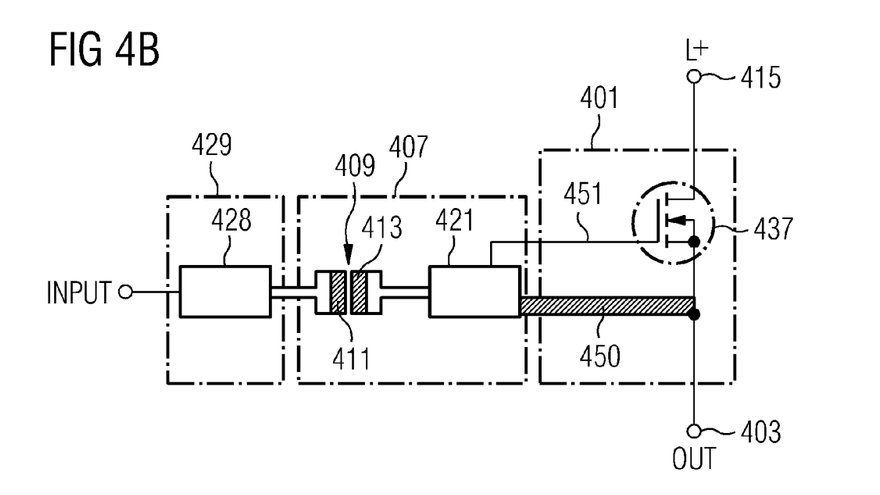

FIGS. 4A and 4B schematically disclose one embodiment of a semiconductor device 400. FIG. 4A illustrates schematically a cross section through the semiconductor device 400 while FIG. 4B illustrates schematically the corresponding electric circuit of semiconductor device 400. Note that semiconductor device 400 may optionally be molded with molding material 440 covering the chips and the bond wires to protect the device from environmental influences.

FIG. 4A discloses a carrier 423 that in this embodiment is a lead frame. Carriers other than a lead frame, e.g. a laminated substrate, may be used as well. Lead frame 423 may have been punched or etched from a metal foil or metal plate to obtain an essentially planar metal structure with several lands insulated from each other. The thickness of the metal foil or metal plate may be in the order of typically 100 to 1000 micrometers. Carrier 423 comprises first island 425 to which first chip 401 is attached, second island 426 to which a control chip 429 (fourth chip) is attached, and other lands 428 for placing bond wires 420 thereon. In this embodiment, islands 425, 426 and all other lands are accessible from the outside.

As shown in FIG. 4A, first chip 401 may comprise a power transistor 437 that may be the same as power transistor 337 of FIG. 3. First chip 401 has a source contact 403 (first electrode) on a first face of the chip, a drain contact 415 (second electrode) on a second face opposite to the first face of the chip, and a gate contact 417 (third electrode) on the first face of the chip. In one embodiment, power transistor 437 has been soldered to first island 425 so that the surface of drain contact 415 is rigidly and electrically conductively connected with first island 425. In another embodiment, power transistor 437 may glued to lead frame 423 with an electrically conductive glue. Further, source contact 403 is connected to land 428 via a bond wire 420. Alternatively, since the current through source contact 403 may be large, the bond wire connecting source contact 403 with land 428 may be replaced by multiple bond wires, a bond ribbon, a clip, or any other conducting element that can carry a large current.

FIG. 4A further discloses a second chip 407 that may be the same as second chip 307 of FIG. 3. Second chip 407 comprises a transformer 409, and an integrated circuit 421 electrically connected with second winding 413. Second chip 407 is attached to source contact 403 of power transistor 437 by means of an electrically conducting glue, solder, or the like. This way, first electrode 403 and the substrate of second chip 407 are mechanically and electrically intimately connected with each other. As a result, the reference potential of integrated circuit 421 is the same as the potential of first electrode 403.

Semiconductor device 400 further comprises a bond wire 419 that connects integrated circuit 421 with gate contact 417. Since the substrate of second chip 407 is kept at the potential of first electrode 403, the output voltage generated by integrated circuit 421 is the same as the voltage between source contact 403 and gate contact 417 of power transistor 437. This way, the load current between source contact 403 and drain contact 415 can be controlled by integrated circuit 421 independent of whether source contact 403 is kept at a fixed potential or not.

Semiconductor device 400 further comprises two or more output bond wires 420 that connect control chip 429 with first winding 411 of second chip 407, and input bond wires 420 that connect control chip 429 with lands 428. The output bond wires are to transfer an output signal of control chip 429 to transformer 409. Control chip 429 may include an integrated circuit (not shown in FIG. 4A) that generates an output signal that is adapted to the electrical performance of transformer 409 and to the integrated circuit 421 to control the gate-source voltage of power transistor 437. This way, control chip 429 may control the load current of power transistor 437 depending on the signal on the input bond wires 420 between control chip 429 and lands 428.

For example, if transformer 409 is a coreless transformer, transformer 409 may be able to effectively transfer only signals of very high frequencies, e.g. frequencies larger than 50 MHz. In this case, the integrated circuit of control chip 429 may be configured to generate pulse sequences of sufficiently high frequencies, or pulses with sufficiently short rise—and fall time. The receiver circuit of integrated circuit 421 of second chip 407 in turn is adapted to receive the high frequency signal and to convert it to a output voltage that, when applied to gate and source of power transistor 437, generates a desired load current between source contact 403 and drain contact 415 of power transistor 437.

It is noted that, because of transformer 409, the load current of power transistor 437 between source contact 403 and drain contact 415 can be controlled almost independently of the potentials assumed by source contact 403 and drain contact 415. This is due to the fact that the transformer galvanically separates the reference potential of the control chip 429 from the reference potential of the second coil 413. This way, with second chip 407 attached to first electrode 403 in an electrically conductive way, the reference potential of second coil 413 can be fixed to the potential of first electrode 403. Since the load current of power transistor 337 is mainly controlled by the voltage between source contact 403 and gate contact 417, and since the reference potential of second coil 413 is kept at the potential of first electrode 403, the load current of power transistor 437 may be controlled by control chip 429 essentially independently of the potentials of source contact 403 and drain contact 415.

FIG. 4B discloses the electronic circuit of semiconductor device 400. In FIG. 4B, the three dashed line boxes 401, 407 and 429 represent, respectively, the chip with power transistor 437, the second chip with transformer 409 and integrated circuit 421, and the control circuit chip. FIG. 4B further discloses external contacts, i.e. land INPUT connected with control circuit chip 429 for controlling control circuit chip 429 that in FIG. 4A corresponds to land 428 connected to control circuit chip 429; land L+ connected with drain 415 of power transistor 437 that in FIG. 4A corresponds to first island 425 connected to drain contact 415; and land OUT connected with source contact 403 that delivers an output current and in FIG. 4A corresponds to land 428 connected with source contact 403. Further, first connection line 450 between source contact 403 and integrated circuit 421 in FIG. 4B corresponds in FIG. 4A to the electrically conductive interface between first electrode 403 of power transistor 337 and the backside of second chip 407 established by the attachment of second chip 407 to first electrode 403 of power transistor 437. Connection line 450 is shown in FIG. 4B as a fat line due to the stron bond between the two. Further, second line 451 in FIG. 4B between gate contact 417 and integrated circuit 421 corresponds in FIG. 4A to bond wire 419.

Further, FIG. 4B shows integrated circuit 421 and transformer 409 of second chip 407 with transformer 409. Transformer 409 has first winding 411 connected to control chip 429 by means of bond wires 420, and second winding 413 connected to integrated circuit 421 by means of internal conducting lines integrated in second chip 407. Further, FIG. 4B shows integrated control circuit 430 of circuit of control chip 429 connected to first winding 411 by means of two or more bond wires (see FIG. 4A), and connected to input terminal INPUT by means of at least two bond wires.

Figure 5A:
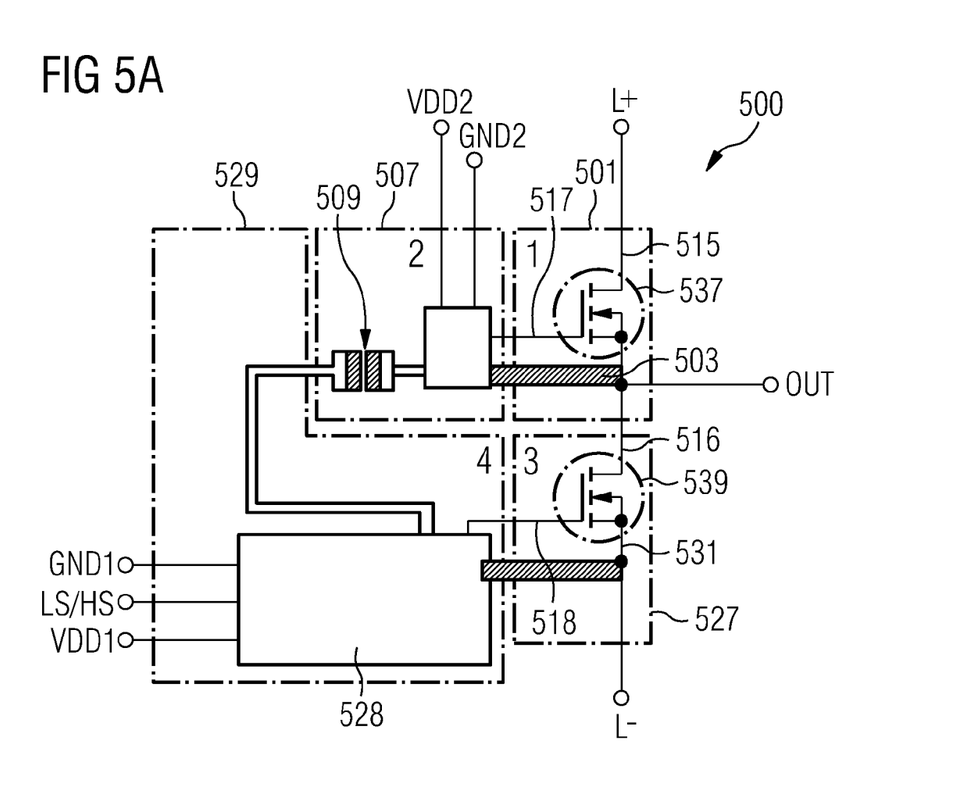
FIGS. 5A-5C disclose an embodiment of a semiconductor device comprising a first chip comprising a first electrode on a first face, a second chip attached to the first electrode, a third chip comprising a first electrode on a first face and a fourth chip attached to the first electrode of the third chip.
Figure 5B:
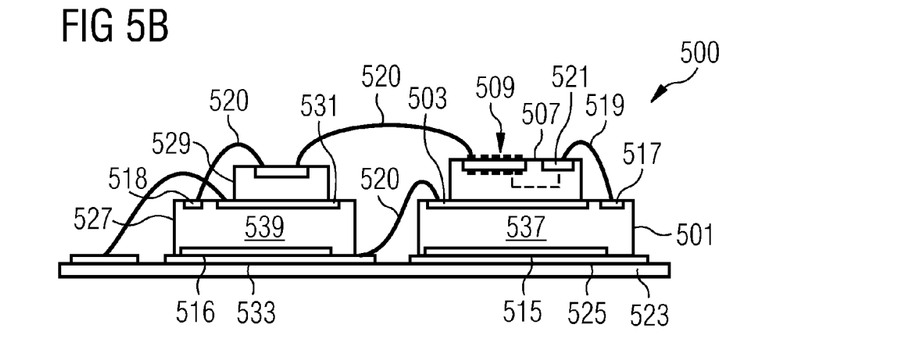
Figure 5C:
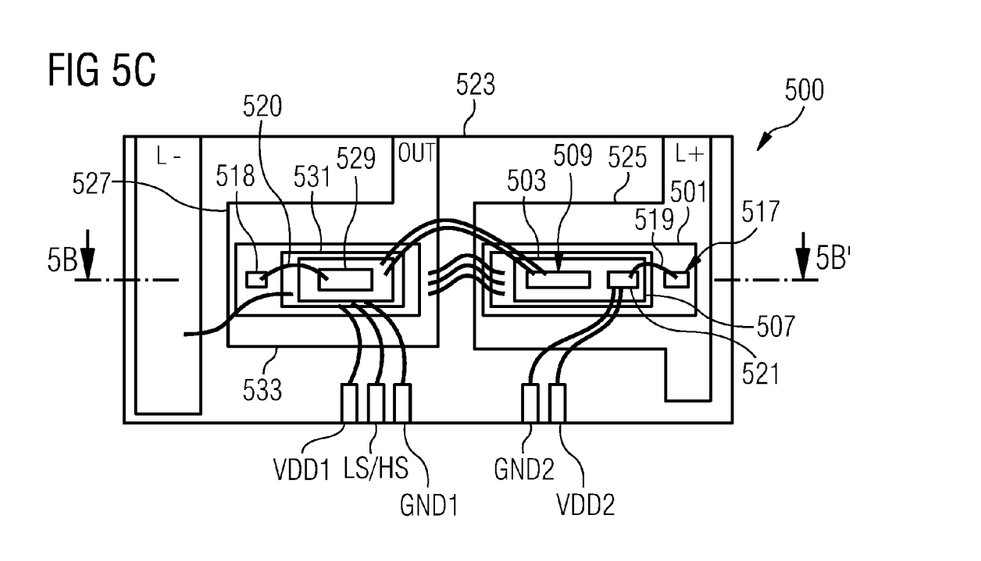

FIGS. 5A to 5C schematically disclose an embodiment of a semiconductor device 500 that may serve as a half-bridge circuit for driving a high power device with a voltage between L+ and L−. FIGS. 5A to 5C illustrate the setup and function of the device in three different views.

FIG. 5A illustrates schematically the electric circuit of the half-bridge circuit 500. Half-bridge circuit 500 is comprised of a first power transistor 537 that is integrated in first power transistor chip 501 (first chip). Drain contact 515 (first drain) of first power transistor 537 is connected with a positive power supply line L+, source contact 503 (first source) of first power transistor 537 is connected with output terminal OUT and with second drain contact 516 of second power transistor 539. Gate contact 517 (first gate) of first power transistor 537 is connected with the output of integrated circuit 521 of second chip 507. Note that in FIG. 5A, the electric conductive connection between first source contact 503 and integrated circuit 321 is drawn with a thick line to indicate that the connection may be realized by a rigid attachment of the backside of second chip 507 to the surface of first source contact 503 of first power transistor 537 (first chip). Further, the connection between first gate contact 517 and integrated circuit 521 may be realised by a bondwire 519 connecting first power transistor chip 501 with second chip 507.

Half-bridge circuit 500 is further comprised of second power transistor 539 that is integrated in second power transistor chip 527 (third chip). As mentioned above, second drain contact 516 of second power transistor 539 is connected with first source contact 503 of first power transistor 537, second source contact 531 of second power transistor 539 is connected with negative power supply line L− and with the reference voltage of the control circuit 528 of control chip 529, and second gate contact 518 of second power transistor 539 is connected with control circuit 528 as well. Note that in FIG. 5A, the electric conductive connection between second source contact 531 and control circuit 528 is drawn with a thick line to indicate that the connection may be realized by by a rigid attachement of the backside of control chip 529 (fourth chip) to the surface of second source contact 531 of second power transistor 539 (third chip). Further, the connection between second gate contact 518 and control circuit 528 may be realised by a bondwire connecting second power transistor chip 527 with control chip 529.

Half-bridge circuit 500 is further comprised of second chip 507 comprising a transformer 509 and an integrated circuit 521. Integrated circuit 521 is connected with positive supply voltage VDD2 and with reference voltage GND2. In addition, integrated circuit 521 is connected with control circuit 528 via transformer 509. Like in FIGS. 4A and 4B, integrated circuit 521 is to receive input signals from transformer 509 and to convert the signals to voltages on first gate contact 517 that control the load current of first power transistor 537 in a predetermined way.

Half-bridge circuit 500 is further comprised of control circuit chip 529 comprising control circuit 528. Control circuit 528 is connected with positive supply voltage VDD1, with reference voltage GND1, and with input signal LS/HS that provides the signals for controlling first power transistor 537 and second power transistor 539 Based on the LS/HS signal, control circuit 528 delivers a voltage to second gate contact 518 that either switches the load current of second power transistor 539 on or off. In addition, control circuit 528 is capable of delivering a signal to integrated circuit 521 via transformer 509. Integrated circuit 521 in turn converts the signal into a voltage signal to first gate contact 517 that controls the load current of first power transistor 537.

With transformer 509, it is possible that the reference voltage of control circuit 528 is at the potential of the source of second power transistor 539 while the reference potential of integrated circuit 521 is at the potential of the drain of second power transistor 539. This way, first power transistor 537 and second power transistor 539 can be switched on and off alternatingly.

FIGS. 5B and 5C illustrate a realization of the half-bridge circuit 500 shown in FIG. 5A. FIG. 5B is a cross section through the half-bridge circuit device along the line 5B-5B' of FIG. 5C while FIG. 5C is a top view on the device.

FIG. 5B and FIG. 5C disclose an embodiment of half-bridge circuit 500 of FIG. 5A wherein first power transistor 537 (first chip) and second power transistor 539 (third chip) are attached to a same carrier 523. In the embodiment, carrier 523 is a laminated substrate comprised of a sheet of insulating material, e.g. polymer, ceramic, and the like, and a structured metal layer laminated to the sheet of insulating material. The structured metal layer may be made, e.g., of a copper.

Structured metal layer of carrier 523 is structured to comprise a first island 525 to which first power transistor chip 501 is soldered or glued, and a second island 533 to which second power transistor chip 527 is soldered or glued. Structured metal layer is further comprised of lands like: land L– for providing a negative voltage to the source of second power transistor 539; land L+ for providing a positive voltage to the drain of first power transistor 537; land OUT for accessing the output of half-bridge circuit 500 between first power transistor 537 and second power transistor 539; land VDD1 and land GND1 for providing a supply voltage for the control circuit 528 of control circuit chip 529; land LS/HS for providing timing signals to control circuit 528 that determine the timing of the switching of first power transistor 537 and second power transistor 539; and land VDD2 and land GND2 for providing a supply voltage for integrated circuit 521 of second chip 507. Note that land OUT is merged with second island 533 so that the potential of OUT and the potential of second drain contact 516 are the same, and that land L+ is merged with first island 525 so that the potential of OUT and the potential of first drain contact 515 are the same.

First power transistor 537 and second power transistor 539 may or may not be the same type of power transistors. They may or may not be of the same type as power transistor 437 of FIG. 4A. First power transistor 537 may have a first source contact 503 (first electrode) and a first gate contact 517 (third electrode) on a first face of first power transistor chip 501, and a first drain contact (second electrode) on a second face of first power transistor chip 501 opposite to the first face. Second power transistor 539 may as well have a second source contact 531 and a second gate contact 518 on a first face of second power transistor chip 527 (third chip), and a second drain contact 516 on a second face of second power transistor chip 527 opposite to the first face.

Both power transistors 537, 539 may be attached to their respective islands 525, 533 with their respective drain contacts facing the islands. Like in the previous embodiments, the attachment of the power transistor 537, 539 may be carried out by soldering, diffusion soldering, welding, sintering or gluing.

FIGS. 5B and 5C further disclose second chip 507 attached to first source contact 503 of first power transistor 537. The attachment of second chip 507 to first source contact 503 may be carried out by soldering, diffusion soldering, sintering, or gluing with an electrically conductive glue. This way, the attachement of second chip 507 to first source contact 503 provides for a mechanically rigid, space saving and low-ohmic connection between first source contact 503 and the substrate of second chip 507. The connection may be low-ohmic partially due to the large area of the interface between second chip 507 and first source contact 503, and due to the short distance between second source contact 531 and the substrate of second chip 507. Further, due to the attachment of second chip 507 to first source contact 503, no additional bond wire needs to be implemented between the two.

Second chip 507 may be the same chip as second chip 407 of FIG. 4A. It may have an integrated circuit 521 electrically connected to gate contact 517 via a bond wire 519, and a transformer 509. Due to the vicinity of first gate contact 517 to first source contact 503 on first power transistor chip 501, bond wire 519 can be short. Transformer 509 may have a first winding (not shown in FIGS. 5A and 5B) electrically connnected with control chip 529 by means of a bond wire 520, and a second winding (not shown in FIGS. 5A and 5B) electrically connected with integrated circuit 521 of second chip 507.

Like in the previous embodiments, integrated circuit 521 may have a receiver circuit adapted to convert a signal received from transformer 509 to deliver, via bond wire 519, an output voltage to first gate contact 517. The output voltage in turn controls the load current in power transistor 537.

FIGS. 5B and 5C further disclose control chip 529 (fourth chip) attached to second source contact 531. Attachment may be carried out by soldering, diffusion soldering, welding, or by gluing with an electrically conducting glue. The electrode of second source contact 531 may be as large or larger than the backside area of control chip 529. Since control chip 529 is attached to second source contact 531 in an electrically conducting manner, the substrate of control chip 529 is of the same potential as the second source contact 531. Further, the attachement of control circuit chip 529 to second source contact 531 provides for a mechanically rigid, space saving connection between second source contact 531 and the substrate of fourth chip 529. Further, due to the vicinity of second gate contact 518 to second source contact 531 on second power transistor chip 527, the bond wire 520 between the two can be short.

Figure 6A:
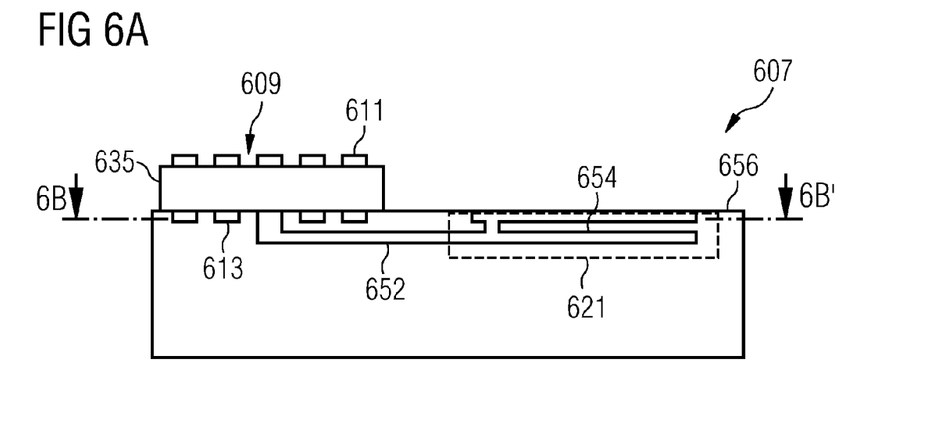
FIGS. 6A and 6B disclose an embodiment of a chip comprising a transformer.
Figure 6B:
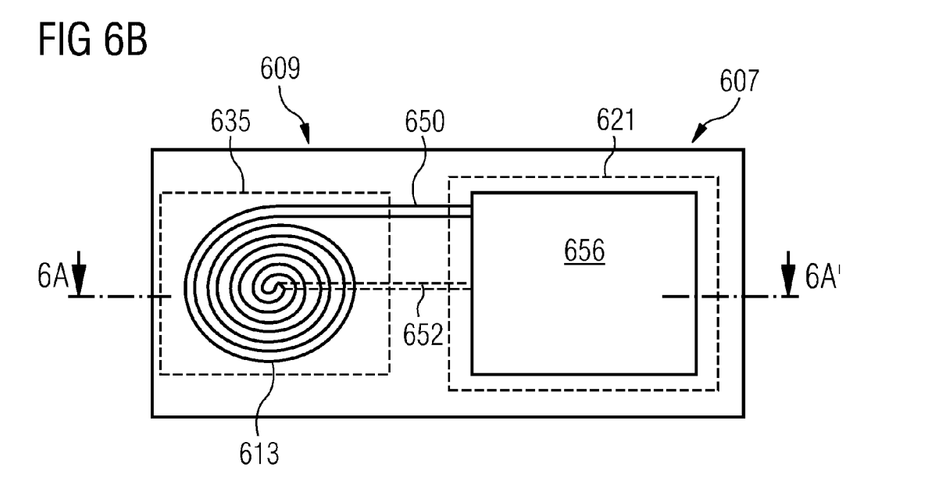

FIGS. 6A and 6B schematically disclose an embodiment of a second chip 607 that may be used in one of the embodiments of semiconductor devices shown in the previous figures. FIG. 6A schematically illustrates a vertical cross section through second chip 607 along the line 6A-6A' shown in FIG. 6B while FIG. 6B schematically illustrates a horizontal cross section along the line 6B-6B' of FIG. 6A illustrating the structure of second metallization plane 656 of second chip 607.

FIGS. 6A and 6B depicts second chip 607 as comprising an integrated circuit 621 and a transformer 609. In one embodiment, transformer 609 is a coreless transformer consisting of a first planar coil 611 (first winding) and second planar coil 613 (second winding) separated from each other by dielectric layer 635. Dielectric layer 635 may be made of, e.g., silicon oxide, a nitride, an imide or any other insulating material. The thickness of dielectric layer 635 needs to be thick enough for withstanding a predetermined voltage defined by a given application. For example, if dielectric layer 635 is made of a silicon oxide, and if the thickness of dielectric layer 635 is 10 micrometer, the dielectric layer 635 can withstand a voltage of up to 10 kV. For applications that require galvanic insulation against a higher voltage, a larger thickness of dielectric layer 635 may be chosen. In one embodiment, first winding 611 and second winding 613 consist each of a planar spirally-shaped winding that are co-aligned with respect to a common axis vertical to the planar windings. A good alignment provides for a good magnetic coupling between the two coils.

In one embodiment, first winding 611 and second winding 613 are manufactured by using planar thin-film techniques, i.e. film deposition, photo-lithographic structuring of films, and the like. In one embodiment, first winding 611 and second winding 613 are manufactured by depositing a metal layer on second chip 607 and, afterwards, structuring the metal layer by etching the metal layer selectively to a mask.

Second winding 613 of transformer 609, in contrast, may be electrically connected with integrated circuit 621 by means of first line 650 extending from one end of second winding 613 to integrated circuit 621, and by means of second line 652 extending from the other end of second winding 613 to integrated circuit 621.

Figure 7A:
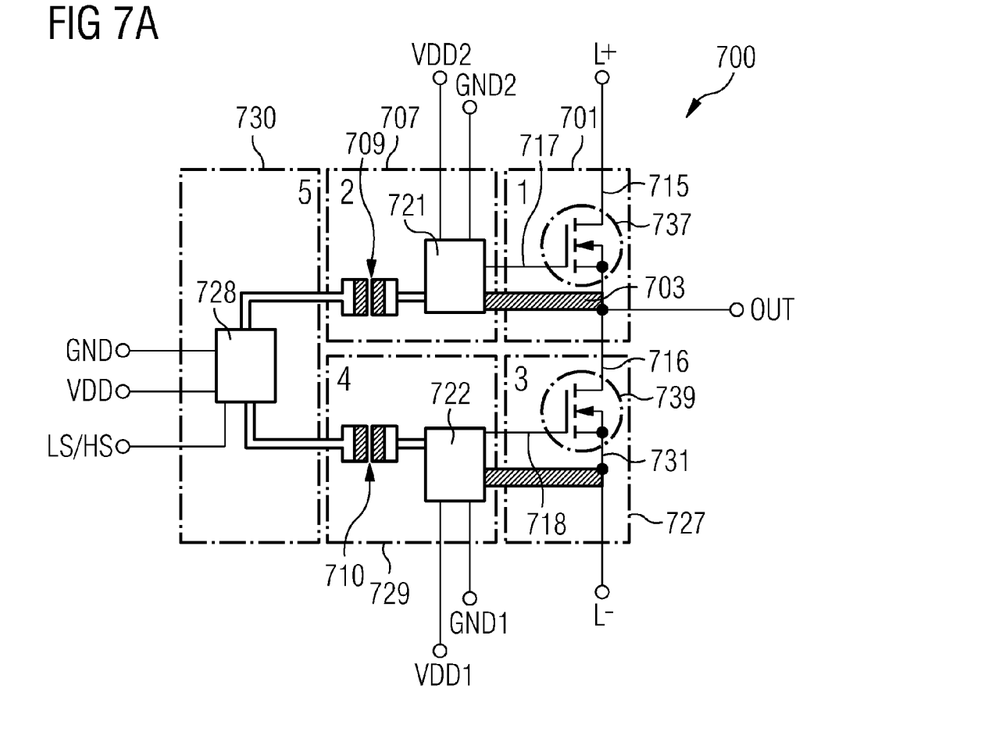
FIG. 7A to 7C disclose an embodiment of a chip comprising a further transformer.
Figure 7B:
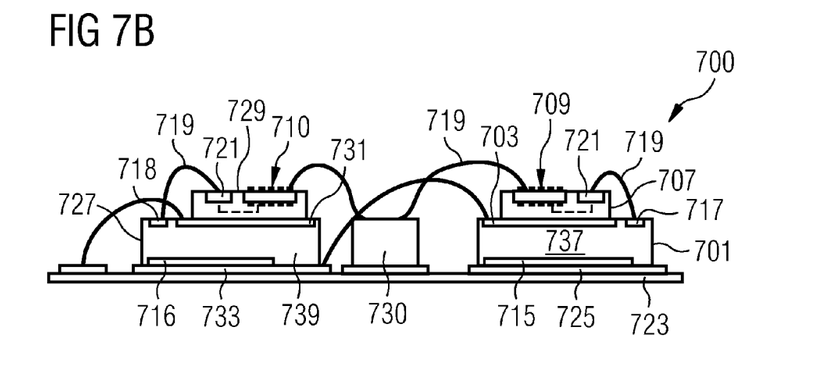
Figure 7C:
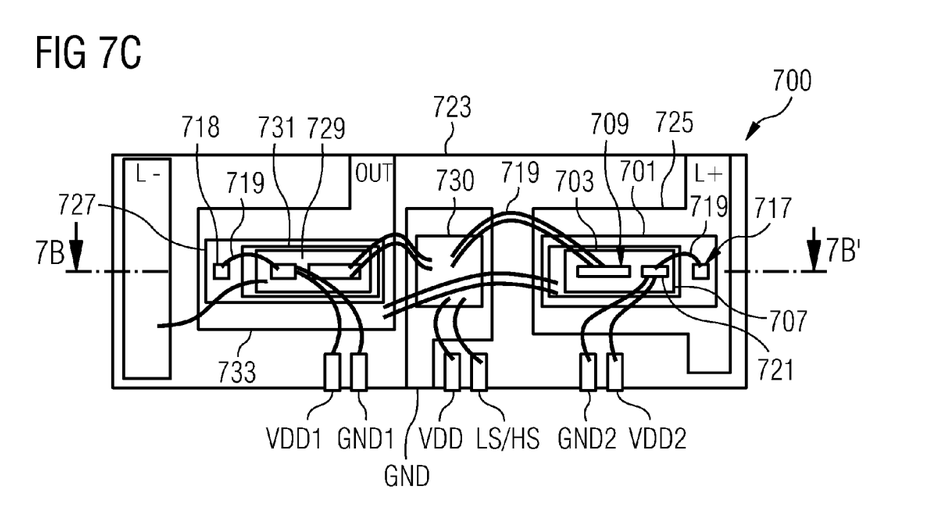

FIGS. 7A to 7C schematically disclose an embodiment of a semiconductor device 700 that may serve as a half-bridge circuit for driving a high power device with a voltage between L+ and L−. The embodiment resembles in many ways the embodiment described in FIGS. 5A to 5C. However, the embodiment of FIGS. 7A to 7C differs from the embodiment of FIGS. 5A to 5C in that fourth chip 729 comprises a further transformer 710 to galvanically separate the control signals coming from LS/HS from second gate contact 718 (third electrode of third chip). The galvanical separation may help to separate the reference voltages GND, VDD of control circuit 728 from the reference voltages of the power transistors to reduce interferences between the control circuit and the power circuits.

Like FIG. 5A for half-bridge circuit device 500, FIG. 7A illustrates schematically the electric circuit of the half-bridge circuit 700. Half-bridge circuit 700 is comprised of a first power transistor 737 that is integrated in first power transistor chip 701 (first chip 1). Drain contact 715 (first drain) of first power transistor 737 is connected with a positive power supply line L+, source contact 703 (first source) of first power transistor 737 is connected with output terminal OUT and with second drain contact 716 of second power transistor 739. Gate contact 717 (first gate) of first power transistor 737 is connected with the output of integrated circuit 721 of second chip 707 (second chip 2). Note that in FIG. 7A, the electric conductive connection between first source contact 703 and integrated circuit 721 is drawn with a thick line to indicate that the connection may be realized by an attachment of the backside of second chip 707 to the surface of first source contact 703 of first power transistor 737 (first chip). Further, the connection between first gate contact 717 and integrated circuit 721 may be realised by a bondwire 719 connecting first power transistor chip 701 with second chip 727.

Half-bridge circuit 700 is further comprised of second power transistor 739 that is integrated in second power transistor chip 727 (third chip 3). As mentioned above, second drain contact 716 of second power transistor 739 is connected with first source contact 703 of first power transistor 737, and second source contact 731 of second power transistor 739 is connected with negative power supply line L−. Further, second gate contact 718 (second gate contact) of second power transistor 739 is connected with the output of a further integrated circuit 722 of fourth chip 729 (fourth chip 4). Note that in FIG. 7A, the electric conductive connection between second source contact 731 and further integrated circuit 722 is drawn with a thick line to indicate that the connection may be realized by an attachment of the backside of fourth chip 729 to the surface of second source contact 731 of second power transistor 727 (third chip 3). Further, the connection between second gate contact 718 and further integrated circuit 722 may be realised by a bondwire 719 connecting second power transistor chip 727 (third chip 3) with fourth chip 729.

Second chip 707 of FIG. 7A, like second chip 507 of FIG. 5A, comprises a transformer 709 and an integrated circuit 721. Integrated circuit 721 is connected with positive supply voltage VDD2 and with reference voltage GND2. In addition, integrated circuit 721 is connected with control circuit 728 via transformer 709. Like in FIGS. 4A and 4B, integrated circuit 721 is to receive input signals from transformer 709 and to convert the signals to voltages on first gate contact 717 that control the load current of first power transistor 737 in a predetermined way.

Fourth chip 729 may be identical to second chip 707. It comprises further transformer 710 and an integrated circuit 722. Integrated circuit 722 is connected with positive supply voltage VDD1 and with reference voltage GND1. In addition, integrated circuit 722 is connected with control circuit 728 via transformer 710. Like integrated circuit 722, integrated circuit 721 is to receive input signals from further transformer 710 and to convert the signals to voltages on second gate contact 718 that control the load current of second power transistor 739 in a predetermined way.

Control circuit chip 730 (fifth chip 5) comprises a control circuit 728. Control circuit 728 is connected with input signal LS/HS that provides the signals for controlling first power transistor 737 and second power transistor 739. Based on the LS/HS signal, control circuit 728 delivers a voltage to integrated circuit 721 and to further integratzed circuit 722 via respective transformers 709 and further transformer 710. Integrated circuits 721 in turn converts the input signal into a voltage signals to first gate contact 717 that controls the load current of first power transistor 737 while further integrated circuits 722 converts the input signal into a voltage signals to second gate contact 718 that controls the load current of second power transistor 739. With transformer 709 coupled with first power transistor 737 and with further transformer 710 coupled to second power transistor 739, the reference voltage of control circuit 728 may be independent of the reference voltages GND1 and GND2 of the first power transistor 737 and the second power transistor 739.

FIGS. 7B and 7C illustrate a realization of the half-bridge circuit 700 of FIG. 7A. FIG. 7B is a cross section through the half-bridge circuit device along the line 7B-7B' of FIG. 7C while FIG. 7C may be a top view on the device.

FIG. 7B and FIG. 7C disclose an embodiment of half-bridge circuit 700 of FIG. 7A wherein first power transistor 737 (first chip 1) and second power transistor 739 (third chip 3) are attached to a same carrier 723. Like in FIGS. 5B and 5C, carrier 723 may be a laminated substrate comprised of a sheet of insulating material, e.g. polymer, ceramic, and the like, and a structured metal layer laminated to the sheet of insulating material. The structured metal layer may be made, e.g., of a copper.

Structured metal layer of carrier 723 is structured to comprise a first island 725 to which first power transistor chip 701 (first chip 1) is soldered or glued, and a second island 733 to which second power transistor chip 727 (third chip 3) is soldered or glued. Structured metal layer is comprised of lands like: land L− for providing a negative voltage to the source of second power transistor 739; land L+ for providing a positive voltage to the drain of first power transistor 737; land OUT for accessing the output of half-bridge circuit 700 between first power transistor 737 and second power transistor 739; land GND and land VDD for providing a supply voltage for control circuit 728 (chip 5); land VDD2 and land GND2 for providing a supply voltage for integrated circuit 721 (second chip 2); land VDD1 and land GND1 for providing a supply voltage for further integrated circuit 722 (fourth chip 4); and land LS/HS for providing timing signals to control circuit 728 that determine the timing of the switching of first power transistor 737 and second power transistor 739. Note that land OUT is merged with second island 733 so that the potential of OUT and the potential of second drain contact 716 are the same; further, land L+ is merged with first island 525 so that the potential of OUT and the potential of first drain contact 515 are the same.

First power transistor 737 and second power transistor 739 may or may not be the same type of power transistors. Also, they may or may not be of the same type as power transistor 537 of FIG. 5A. First power transistor 737 may have a first source contact 703 (first electrode) and a first gate contact 717 (third electrode) on a first face of first power transistor chip 701, and a first drain contact (second electrode) on a second face of first power transistor chip 701 opposite to the first face. Second power transistor 739 may as well have a second source contact 731 and a second gate contact 718 on a first face of second power transistor chip 727 (third chip), and a second drain contact 716 on a second face of second power transistor chip 727 opposite to the first face.

Both power transistors 737, 739 may be attached to their respective islands 725, 733 with their respective drain contacts facing the islands. Like in the previous embodiments, the attachment of the power transistor 737, 739 may be carried out by soldering, diffusion soldering, welding, sintering, gluing, and the like.

FIGS. 7B and 7C further disclose second chip 707 attached to first source contact 703 of first power transistor 737. The attachment of second chip 707 to first source contact 703 may be carried out by soldering, diffusion soldering, sintering, or gluing with an electrically conductive glue. This way, the attachement of second chip 707 to first source contact 703 provides for a mechanically rigid, space saving and low-ohmic connection between first source contact 703 and the substrate of second chip 707. The connection may be low-ohmic partially due to the large area of the interface between second chip 707 and first source contact 703, and due to the short distance between second source contact 731 and the substrate of second chip 707. Further, due to the attachment of second chip 707 to first source contact 703, no additional bond wire needs to be implemented between the two.

Second chip 707 may be the same chip as second chip 507 of FIG. 5A. It may have an integrated circuit 721 electrically connected to gate contact 717 via a bond wire 719, and a transformer 709. Due to the vicinity of first gate contact 717 to first source contact 703 on first power transistor chip 701, bond wire 719 can be made short. Transformer 709 may have a first winding (not shown in FIG. 5A and 5B) electrically connnected with control chip 730 by means of a bond wire 719, and a second winding (not shown in FIGS. 7A and 7B) electrically connected with integrated circuit 721 of second chip 707. Further, like in the previous embodiments, integrated circuit 721 may have a receiver circuit adapted to convert a signal received from transformer 709 to deliver, via bond wire 719, an output voltage to first gate contact 717. The output voltage in turn controls the load current in power transistor 737.

FIGS. 7B and 7C further disclose fourth chip 729 attached to second source contact 731 of second power transistor 739. As mentioned above, fourth chip 729 may be the same as second chip 707. Further, the attachment of fourth chip 729 to second source contact 731 may be carried out by soldering, diffusion soldering, sintering, or gluing with an electrically conductive glue, like the attachment of second chip 707 to first source contact 703 of first chip 707.

Like second chip 707, fourth chip may have a further integrated circuit 722 electrically connected to second gate contact 718 via a bond wire 719, and a further transformer 710. Further transformer 710 may have a first winding (not shown in FIGS. 7A and 7B) electrically connnected with control chip 730 by means of a bond wire 719, and a second winding (not shown in FIGS. 7A and 7B) electrically connected with further integrated circuit 722 of fourth chip 729.

FIGS. 7B and 7C further disclose control circuit 728 of fifth chip 730 (fifth chip 5) attached land GND, and bond wires 719 connecting control circuit chip 728 with integrated circuit 721 of second chip 709 and with further integrated circuit 722 of fourth chip 710.

Although specific embodiments have been illustrated and described herein, it will be appreciated by those of ordinary skill in the art that a variety of alternate and/or equivalent implementations may be substituted for the specific embodiments shown and described without departing from the scope of the present invention.

For example, while the connections between the chips of half-bridge circuit are realied by wire bonds and by direct attachment of one chip to another chip, one or several of the bond wires may be replaced by bond ribbons, by contact clips that generally can carry larger currents than bond wires, or by conducting lines that are printed, deposited or grown over the surface of the chips and the carrier in ways well known in the art.

Further, for example, while embodiments of semiconductor devices have been described herein that either use a lead frame or laminate substrate as a carrier, the carrier types may be exchanged or other carrier types be used without departing from the scope of the invention.

Further, for example, while embodiments of the semiconductor devices have been described herein with that have vertical power transistors, the power transistors may also be MOS transistors, IGBT or MOS power transistors with load currents flowing laterally to the main surfaces of the chips without departing from the scope of the invention.

Generally, this application is intended to cover any adaptations or variations of the specific embodiments discussed herein. One example of a variation is a half-bridge configuration including two freewheeling diodes, connected parallel to the first and to the second power transistor each. Therefore, it is intended that this invention be limited only by the claims and the equivalents thereof.

What is claimed is:
1. A semiconductor device comprising:
   a first chip comprising a first electrode on a first face of the first chip; and
   a second chip attached to the first electrode, the second chip comprising a transformer comprising a first winding and a second winding,
   a carrier comprising a first island to which the first chip is attached; and
   a third chip attached to the carrier and electrically coupled to the first electrode of the first chip.
2. The semiconductor device according to claim 1 wherein the third chip comprises a first electrode on a first face of the third chip and a second electrode on a second face of the chip opposite to the first face.

3. The semiconductor device according to claim 2 further comprising a fourth chip attached to first electrode of the third chip.

4. The semiconductor device according to claim 2 further comprising a fourth chip attached to the carrier and electrically coupled to the first winding.

5. The semiconductor device according to claim 1 wherein the carrier comprises a second chip island to which the third chip is attached.

6. The semiconductor device according to claim 1 wherein the first chip and the third chip each comprise a power transistor.

7. The semiconductor device according to claim 6 wherein the power transistor of the first chip and the power transistor of the third chip form a half-bridge.

* * * * *